(12) United States Patent  (10) Patent No.: US 6,677,729 B2
Arai  (45) Date of Patent: Jan. 13, 2004

(54) METHOD AND UNIT FOR COMPUTING VOLTAGE DROP DIVIDED ALONG FACTORS FOR BATTERY

(75) Inventor: Youichi Arai, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/209,872

(22) Filed: Aug. 2, 2002

(65) Prior Publication Data

US 2003/0025507 A1 Feb. 6, 2003

(30) Foreign Application Priority Data

Aug. 3, 2001 (JP) ........................... 2001-236961

(51) Int. Cl.$^7$ ............... H02J 7/00; A23L 1/28
(52) U.S. Cl. ........................ 320/132; 324/426
(58) Field of Search ............... 320/132, 133, 320/135, 155; 324/426, 433, 430; 702/63

(56) References Cited

U.S. PATENT DOCUMENTS

| | | | | |
|---|---|---|---|---|
| 5,459,671 A | * | 10/1995 | Duley ........................ | 702/63 |
| 5,994,877 A | * | 11/1999 | Seri et al. .................. | 320/132 |
| 6,262,577 B1 | * | 7/2001 | Nakao et al. .............. | 320/135 |
| 6,275,008 B1 | * | 8/2001 | Arai et al. ................. | 320/132 |
| 6,285,163 B1 | * | 9/2001 | Watanabe et al. ......... | 320/132 |
| 6,388,421 B2 | * | 5/2002 | Abe .......................... | 320/132 |
| 6,424,157 B1 | * | 7/2002 | Gollomp et al. .......... | 324/426 |

* cited by examiner

Primary Examiner—Pia Tibbits
(74) Attorney, Agent, or Firm—Armstrong, Kratz, Quintos, Hanson & Brooks, LLP

(57) ABSTRACT

A discharge current and a voltage between a pair of terminals of a battery while a rush current is flowing in a load electrically connected to the pair of the terminals. The rush current simply decreases from a peak to a constant value after the rush current simply increases up to the peak. A first approximate equation is provided for showing a correlation between the current and the voltage in a region where the discharge current is increasing. A second approximate equation is provided for showing a correlation between the current and the voltage in a region where the discharge current is decreasing. A voltage from each of the first and second approximate equations at a point where the discharge current is zero is calculated so that a deference between the two voltages at the current zero point is obtained. The difference is determined to be a total voltage drop due to a concentration polarization of the battery. A voltage drop due to the concentration polarization is calculated from the total voltage drop at any point of the discharge current in use of a relation between the concentration polarization voltage drop and the discharge current with a corresponding discharging time.

20 Claims, 10 Drawing Sheets

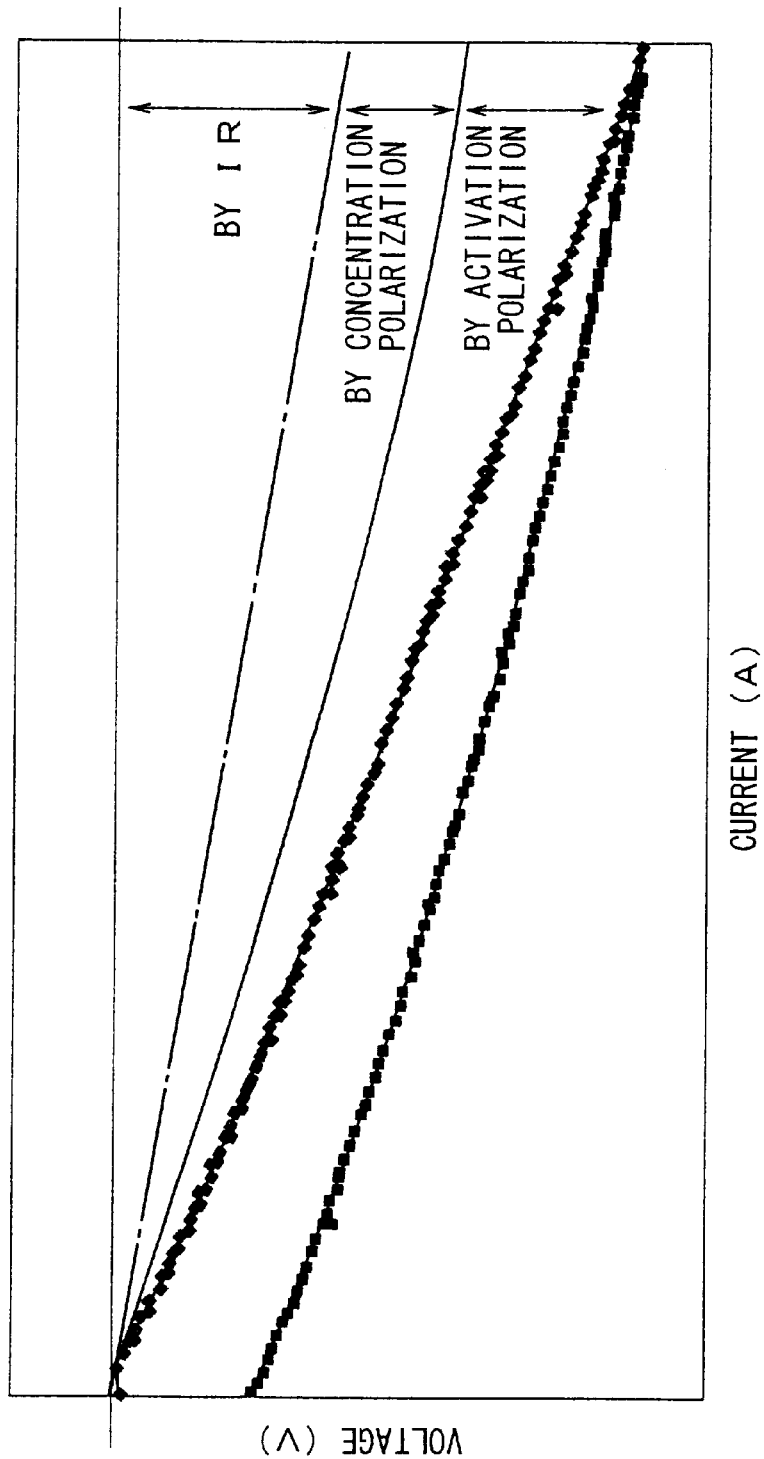

METHOD AND UNIT FOR COMPUTING VOLTAGE DROP DIVIDED ALONG FACTORS FOR BATTERY

BACKGROUND OF THE INVENTION

1. Field of the Invention

The present invention relates to a method and a unit for computing a voltage drop of a battery to supply an electrical power to loads. More specifically, the voltage drop is divided along factors which are separately analyzed in use of a correlation between a discharge current and a terminal voltage (I-V) of the battery.

2. Related Art

Generally, a battery is repeatedly charged within its maximum charging capacity to discharge an electrical power to electrical equipment. The charging capacity decreases rapidly due to an excessive discharge or lack of an electrolyte and also decreases by an aged degradation of the battery. An excessive discharge of the battery, e.g. mounted on a motor vehicle will cause a starter motor not to be able to restart an engine when the battery is decreased in its discharging capacity due to its aged degradation.

An aged battery has a base resistance larger than that of a new battery. For determining replacement of a battery, a base resistance of the aged battery may be measured at a regular maintenance. The measured base resistance can show a degradation of the battery in consideration of a total resistance of the battery which is concluded from the base resistance. The total resistance includes a polarization resistance of the battery.

During discharging of the battery, a voltage drop between a pair of terminals of the battery is due to an inner impedance (combined resistance) of the battery. The voltage drop consists of an IR loss (base resistance, i.e. a voltage drop due to an ohmic resistance) and a voltage drop due to a polarization resistance (activation polarization and concentration polarization) related to a chemical reaction. As illustrated in FIG. 11 showing a correlation between a discharging current and a terminal voltage of a battery, the voltage drop of the IR loss varies linearly relative to a discharge current since a base resistance of the battery is constant.

In the meantime, a voltage drop due to a polarization resistance varies with the magnitude and elapsed time of a discharging current. Thus, a current-voltage correlation including a polarization resistance of the battery is necessary to be analyzed to know a present state of the battery.

Furthermore, it is desired to know an aged state of the battery while the battery is kept at a usage position.

SUMMARY OF THE INVENTION

In view of the aforementioned situation, an object of the invention is a method and a unit for computing a voltage drop of a battery to supply an electrical power to a load. The voltage drop is due to factors which are separately analyzed in use of a correlation between a discharge current and a terminal voltage (I-V) of the battery. The measurement of the discharge current and the terminal voltage can be made while the battery is kept at a usage position.

Another object of the invention is to provide a method and a unit for computing a voltage drop of the battery, in which a concentration polarization of the battery is separately obtained in use of a correlation between a discharge current and a terminal voltage (I-V) of the battery.

For achieving the objects, a first aspect of the invention is a method for computing a voltage drop divided along a plurality of factors for a battery to supply an electrical power to a load, the voltage drop being due to the factors which are separately analyzed in use of a correlation between a discharge current and a terminal voltage of the battery, the method comprising the steps of:

measuring cyclically a discharge current and a voltage between a pair of terminals of the battery while a rush current is flowing in the load electrically connected to the pair of the terminals, the rush current simply decreasing from a peak to a constant value after the rush current simply increases up to the peak, obtaining a first approximate equation showing the correlation between the current and the voltage in a region where the discharge current is increasing and a second approximate equation showing a correlation between the current and the voltage is obtained in a region where the discharge current is decreasing, and calculating a voltage from each of the first and second approximate equations at a point where the discharge current is zero so that a deference between the two voltages at the point where the discharge current is zero is obtained, wherein the deference is determined to be a total voltage drop due to a concentration polarization of the battery.

A second aspect of the invention is a method for computing a voltage drop divided along a plurality of factors for a battery to supply an electrical power to a load, the voltage drop being due to the factors which are separately analyzed in use of a correlation between a discharge current and a terminal voltage of the battery, the method comprising the steps of:

measuring cyclically a discharge current and a voltage between a pair of terminals of the battery while a rush current is flowing in the load electrically connected to the pair of the terminals, the rush current simply decreasing from a peak to a constant value after the rush current simply increases up to the peak, obtaining a first approximate equation showing the correlation between the current and the voltage in a region where the discharge current is increasing and a second approximate equation showing a correlation between the current and the voltage is obtained in a region where the discharge current is decreasing, calculating a voltage from each of the first and second approximate equations at a point where the discharge current is zero so that a deference between the two voltages at the point where the discharge current is zero is obtained, wherein the deference is determined to be a total voltage drop due to a concentration polarization of the battery, and calculating a voltage drop due to the concentration polarization from the total voltage drop at any point of the discharge current in use of a relation between the concentration polarization voltage drop and the discharge current with a corresponding discharging time, so that the concentration polarization voltage drop is obtained separately from a voltage drop due to the other factors. Note that the concentration polarization seems to occur with the rush current.

Preferably, a voltage drop due to the concentration polarization at any point of the discharge current is obtained from the total voltage drop due to the concentration polarization in use of a proportional relationship between the concentration polarization voltage drop and a corresponding discharging time elapsed before the point.

Preferably, the voltage drop due to the concentration polarization is obtained at the peak of the discharge current.

A third aspect of the invention is a method for computing a voltage drop divided along a plurality of factors for a battery to supply an electrical power to a load, the voltage drop being due to the factors which are separately analyzed in use of a correlation between a discharge current and a terminal voltage of the battery, the method comprising the steps of:

measuring cyclically a discharge current and a voltage between a pair of terminals of the battery while a rush current is flowing in the load electrically connected to the pair of the terminals, the rush current simply decreasing from a peak to a constant value after the rush current simply increases up to the peak, obtaining a first approximate equation showing the correlation between the current and the voltage in a region where the discharge current is increasing and a second approximate equation showing a correlation between the current and the voltage is obtained in a region where the discharge current is decreasing, calculating a voltage from each of the first and second approximate equations at a point where the discharge current is zero so that a deference between the two voltages at the point where the discharge current is zero is obtained, wherein the deference is determined to be a total voltage drop due to a concentration polarization of the battery, and calculating a voltage drop due to the concentration polarization from the total voltage drop at the peak of the discharge current in use of a proportional relationship between a concentration polarization voltage drop and a corresponding discharging elapsed time, so that the concentration polarization voltage drop is obtained separately from a voltage drop due to the other factors at the peak of the discharge current.

Preferably, a voltage drop due to the concentration polarization is obtained at any point of the discharge current from the concentration polarization voltage drop at the peak in use of a proportional relationship between the concentration polarization voltage drop and a corresponding elapsed time within the current increasing region up to the peak. Thus, the voltage drop due to the concentration polarization is obtained separately from a voltage drop due to the other factors at any point of the discharge current.

Preferably, a voltage drop due to the concentration polarization at any point of the discharge current within a current decreasing region after the peak is obtained from the voltage drop value at the peak in use of a proportional relationship between the concentration polarization voltage drop and a corresponding elapsed time at the time.

Preferably, voltage drop factors other than the concentration polarization are a base resistance and an activation polarization of the battery.

Preferably, a voltage drop due to factors other than the concentration polarization is obtained by deducting a voltage drop due to a concentration polarization of the battery from the first and second approximate equations so that first and second modified approximate equations are developed, and the first and second modified approximate equations are deducted respectively from the first and second approximate equations to provide first and second concentration polarization approximate equations. Thus, the first and second concentration polarization approximate equations can provide a voltage drop due to the concentration polarization at any point of the discharge current.

Preferably, an equation showing a voltage drop due to a base resistance of the battery is deducted respectively from the first and second modified approximate equations to obtain first and second activation polarization approximate equations showing a voltage drop due to an activation polarization of the battery. Thus, a voltage drop of the battery terminal is separated into each drop due to each of the base resistance, the concentration polarization, and the activation polarization.

Preferably, a voltage drop due to the concentration polarization of the battery is deducted from the first and second approximate equations to obtain first and second modified approximate equations, and at the peak of the rush current, a differential of the voltage relative to the current is obtained for each of the first and second modified approximate equations, wherein an intermediate value of thus obtained voltage differentials is determined as a base resistance of the battery. Thus, a voltage drop due to the base resistance is obtained separately from the other voltage drops.

Preferably, the obtained voltage differentials are averaged to obtain a base resistance of the battery.

Preferably, the obtained voltage differentials are averaged to determine a base resistance in consideration of time lengths of increasing and decreasing regions of the rush current. Thus, the base resistance is determined at the peak in consideration of effects of the concentration and activation polarizations.

Preferably, each of the first and second approximate equations is a quadratic equation. Thereby, the first modified approximate equation is also a quadratic equation which is appropriate for providing a voltage drop due to factors other than the concentration polarization.

Preferably, coefficients of the second approximate equation are determined from three voltage values between zero and the peak of the discharge current including the peak point. Thereby, the second modified approximate equation is obtained with ease.

Preferably, voltage differentials of the first and second modified approximate equations at the current peak are averaged to obtain the intermediate value. Thereby, a base resistance of the battery is obtained from the intermediate value with ease.

Preferably, an equation showing a voltage drop due to the base resistance of the battery is deducted respectively from the first and second modified approximate equations to obtain first and second activation polarization approximate equations showing a voltage drop due to an activation polarization of the battery. Thus, a voltage drop of the battery terminal is separated into each drop due to each of the base resistance, the concentration polarization, and the activation polarization.

A fourth third aspect of the present invention is a unit for computing a voltage drop divided along a plurality of factors for a battery to supply an electrical power to a load, the voltage drop being due to the factors which are separately analyzed in use of a correlation between a discharge current and a terminal voltage of the battery, the unit comprising:

a means for measuring cyclically a discharge current and a voltage between a pair of terminals of the battery while a rush current is flowing in the load electrically connected to the pair of the terminals, the rush current simply decreasing from a peak to a constant value after the rush current simply increases up to the peak, a means for obtaining a first approximate equation showing the correlation between the current and the voltage in a region where the discharge current is increasing and a second approximate equation showing a correlation between the current and the voltage is obtained in a region where the discharge current is decreasing, a means for calculating a voltage from each of the first and second approximate equations at a point where the discharge current is zero so that a deference between the two voltages at the point where the discharge current is zero is obtained, wherein the deference is determined to be a total voltage drop due to a concentration polarization of the battery, and a means for calculating a voltage drop due to the concentration polarization from the total voltage drop at any point of the discharge current in use of a relation between the concentration polarization voltage drop and the discharge current with a corresponding discharging time, so that the concentration polarization voltage drop is obtained separately from a voltage drop due to the other factors.

Preferably, a voltage drop due to the concentration polarization at any point of the discharge current is obtained from the total voltage drop due to the concentration polarization in use of a proportional relationship between the concentration polarization voltage drop and a corresponding discharging time elapsed before the point.

A fifth aspect of the present invention is a unit for computing a voltage drop divided along a plurality of factors for a battery to supply an electrical power to a load, the voltage drop being due to the factors which are separately analyzed in use of a correlation between a discharge current and a terminal voltage of the battery, the unit comprising:

a means for measuring cyclically a discharge current and a voltage between a pair of terminals of the battery while a rush current is flowing in the load electrically connected to the pair of the terminals, the rush current simply decreasing from a peak to a constant value after the rush current simply increases up to the peak, a means for obtaining a first approximate equation showing the correlation between the current and the voltage in a region where the discharge current is increasing and a second approximate equation showing a correlation between the current and the voltage is obtained in a region where the discharge current is decreasing, a means for calculating a voltage from each of the first and second approximate equations at a point where the discharge current is zero so that a deference between the two voltages at the point where the discharge current is zero is obtained, wherein the deference is determined to be a total voltage drop due to a concentration polarization of the battery, and a means for calculating a voltage drop due to the concentration polarization from the total voltage drop at the peak of the discharge current in use of a proportional relationship between the concentration polarization voltage drop and a corresponding discharging time, so that the concentration polarization voltage drop is obtained separately from a voltage drop due to the other factors at the peak of the discharge current.

BRIEF DESCRIPTION OF THE DRAWINGS

FIG. 11 is a graph generally showing a relation between a current and a voltage of a battery during discharging thereof, in which the voltage drop is divided along factors.

DETAILED DESCRIPTION OF PREFERRED EMBODIMENTS

Referring to the accompanied drawings, a method and a unit for computing a voltage drop divided along a plurality of factors for a battery during discharging of the battery. First, referring to FIGS. 3 to 9, a method for computing such a voltage drop will be discussed in detail.

A vehicle has a battery for supplying an electric power to loads mounted on the vehicle. The battery has generally a normal output voltage of 12V or 42V. The vehicle may be an EV (electric vehicle) or a HEV (hybrid electrical vehicle). Such vehicles have an electric load requiring a larger current like a stator motor, a motor generator, or a vehicle driving motor. For example, after a larger current electric load like a starter motor is turned on, a rush current flows through the electric load at an initial step of the starting. Then, the current flowing through the electric load becomes constant according to a capacity of the electric load.

Figure 3:
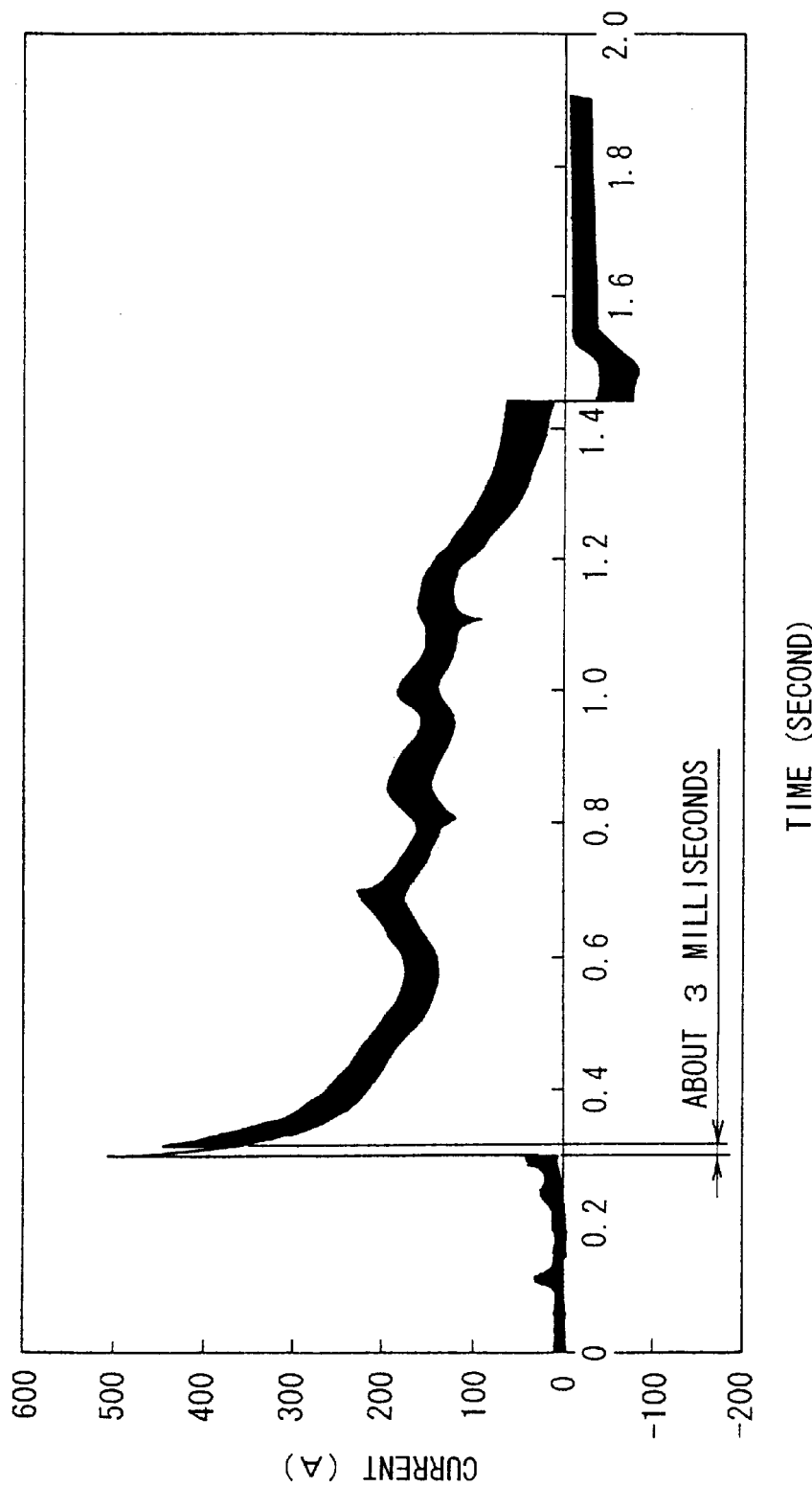
FIG. 3 is a graph of a discharge current of a battery with a rush current which occurs at a starting operation of a starter motor.

When the starter motor is a DC motor, a rush current flowing through a field coil of the motor is illustrated in FIG. 3. The rush current increases sharply up to a peak, e.g. of 500 A (ampere) during a short period, e.g. of 3 milliseconds just after the starting of the electric load. The peak value is several times a normal constant current. The rush current deceases from the peak to the constant value during a comparatively short period, e.g. of 150 milliseconds, which is a discharge current supplied from a battery. In a state where a rush current is flowing through the electric load, a discharge current and a corresponding voltage between a pair of terminals of the battery are measured. Thereby, a correlation between the discharge current (I) and the terminal voltage (V) of the battery is obtained, which shows the terminal voltage varying with the discharge current in a wide region of the discharge current.

Figure 4:
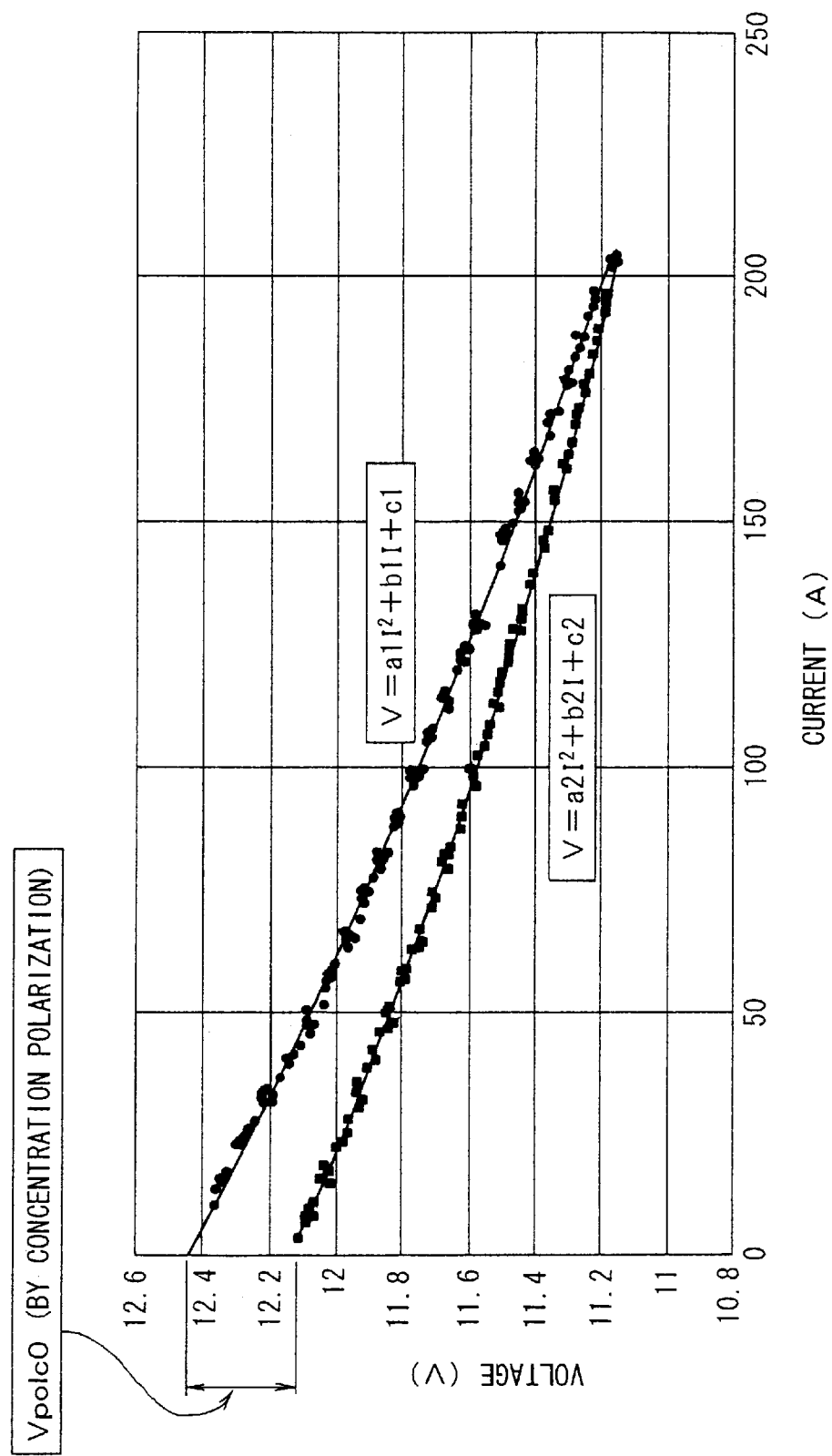
FIG. 4 is a graph showing a relation between a current and a voltage of the battery, the relation being given by approximate quadratic equations.

A discharge pattern of the battery, which is similar to when the starter motor is turned on, is carried out by an experimental controlled load. In the pattern, the discharge current increases from zero to about 200 A during 0.25 seconds and decreases from the peak to zero during 0.25 seconds. At the same time, a discharge current and a corresponding terminal voltage of the battery are measured at short intervals to obtain a data to provide a graph of FIG. 4. In FIG. 4, a horizontal ordinate shows a discharge current, and a vertical ordinate shows a terminal voltage of the battery. The relation between the discharge current and the terminal voltage is given by the following quadratic equations each for a increasing period or a decreasing period of the discharge current.

$$V=a1I^2+b1I+c1 \quad (1)$$

$$V=a2I^2+b2I+c2 \quad (2)$$

The quadratic approximate equations are also illustrated in FIG. 4.

In FIG. 4, a voltage deference between the approximate, equations (1) and (2) when the discharge current is zero includes neither a voltage drop due to a base resistance and an activation polarization of the battery. Thus, the voltage deference at the zero current is determined to be a voltage drop due to a concentration polarization of the battery. The voltage difference at the zero current is designated by Vpolc0.

Next, a method for calculating a concentration polarization at the peak of the rush current in use of Vpolc0 will be discussed. VpolcP designates a voltage drop due to a concentration polarization when the discharge current is at the peak.

$$VpolcP=[(Asec \text{ in current increasing region })/(Asec \text{ in all discharge current region})] \times Vpolc0 \quad (3)$$

where

Asec: integral of current value and time

Note that: Asec in all discharge current region=(Asec in current increasing region)+(Asec in current decreasing region)

Generally, the discharge current varies linearly with an elapsed time in each of the increasing and decreasing regions. Thus, Vpolc0 is divided into a voltage drop due to a concentration polarization in the discharge current increasing region and a voltage drop due to a concentration polarization in the discharge current decreasing region. That is, $$VpolcP=[Tz/Ts] \times Vpolc0 \quad (3')$$

where

Tz: time of the discharge current increasing region

Tg: time of the discharge current decreasing region

Ts: the sum of Tz and Tg

VpolcP=Vpolc0/2, when Tz is equal to Tg

Thus obtained VpolcP is multiplied by a ratio of an elapsed time tz at any current point to Tz to obtain a voltage drop due to a concentration polarization of the battery within the discharge current increasing region. In the meantime, a voltage drop due to a concentration polarization of the battery within the discharge current decreasing region will be calculated in use of Vpolc0, Ts, and an elapsed time up to at any current point.

Figure 5:
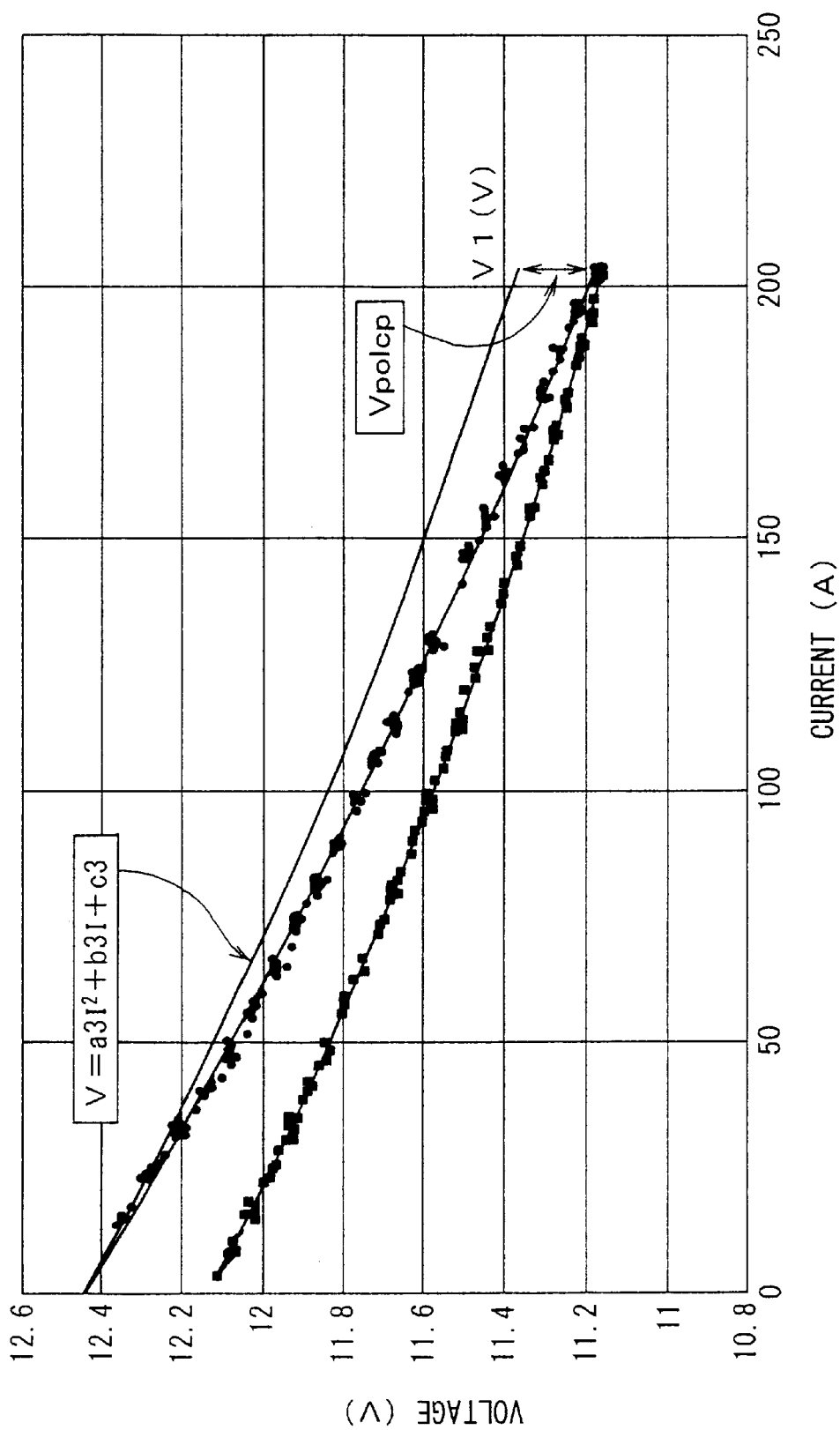
FIG. 5 is a graph particularly showing how to deduct a voltage drop due to a concentration polarization of the battery from one of the approximate equations within a current increasing region.

As illustrated in FIG. 5, thus obtained VpolcP is added to a voltage at the maximum current in equation (1) to obtain V1 which does not include a voltage drop due to a concentration polarization of the battery.

That is, $$V1=a1Ip^2+b1Ip+c1+VpolcP \quad (1)$$

Ip designates a current at the peak.

Next, in use of thus obtained V1, a voltage drop curve due to only the base resistance and the activation polarization is developed as illustrated in FIG. 5.

$$V1=a3I^2+b3I+c3 \quad (4)$$

Regarding equations (1) and (4), when the discharge current is zero (A), the voltages of equations (1) and (4) are same, so that c3 is equal to c1. A reaction of the concentration polarization in an initial increasing stage of the discharge current is slow so that a differential of equation (1) is equal to a differential of equation (4) at zero (A) point of the current. Thus, b3 is equal to b1. Equation (4) is rewritten by substituting c3=C1 and b3=b1 to obtain the following equation.

$$V1=a3I^2+b1I+c1 \quad (5)$$

Thus, an unknown constant is only a3.

Therefore, ordinates (Ip, V1) at the peak of the current are substituted in equation (5) to obtain the constant a3.

$$a3=(V1-b1Ip-c1)/Ip^2$$

Accordingly, a voltage drop due to only the base resistance and the activation polarization is determined by employing equations (4) and (5).

In use of thus obtained equations (5) and (1), the following approximate equation is given for determining a voltage drop due to the concentration polarization within the current increasing region.

$$Vcz=(a3-a1)I^2 \quad (6a)$$

Thus, a voltage drop Vczn due to the concentration polarization at any current In is given by:

$$Vczn=(a3-a1)In^2 \quad (6b)$$

Therefore, a concentration polarization resistance Rcz in the current increasing region is given by:

$$Rczn=(a3-a1)In \quad (6c)$$

Generally, a base resistance of the battery, which is not related to a chemical reaction in the battery, is constant when a state of charge and temperature is not varying. That is, the base resistance is constant during one operation of the starter motor. On the contrary, an activation polarization resistance of the battery is related to a chemical reaction including transfer of ions and electrons, so that the activation polarization has a relation with the concentration polarization of the battery.

Next, a deduction method of a concentration polarization of the battery in the current deceasing region will be discussed.

Two points A and B other than the peak are selected, and VpolcA and VpolcB which are respectively a voltage drop due to a concentration polarization at point A or B are given by:

$$VpolcA=[(Asec \text{ integration from zero to point A})/(Asec \text{ in all discharge current region})] \times Vpolc0 \quad (7)$$

or more simply $$VpolcA=[Ta \text{ (time from the peak to point A)}/Tg] \times (Vpolc0-VpolcP) \quad (7')$$

$$VpolcB=[(Asec \text{ integration from zero to point B})/(Asec \text{ in all discharge current region})] \times Vpolc0 \quad (8)$$

or more simply $$VpolcB=[Tb \text{ (time from the peak to point B)}/Tg] \times (Vpolc0-VpolcP) \quad (8')$$

Figure 6:
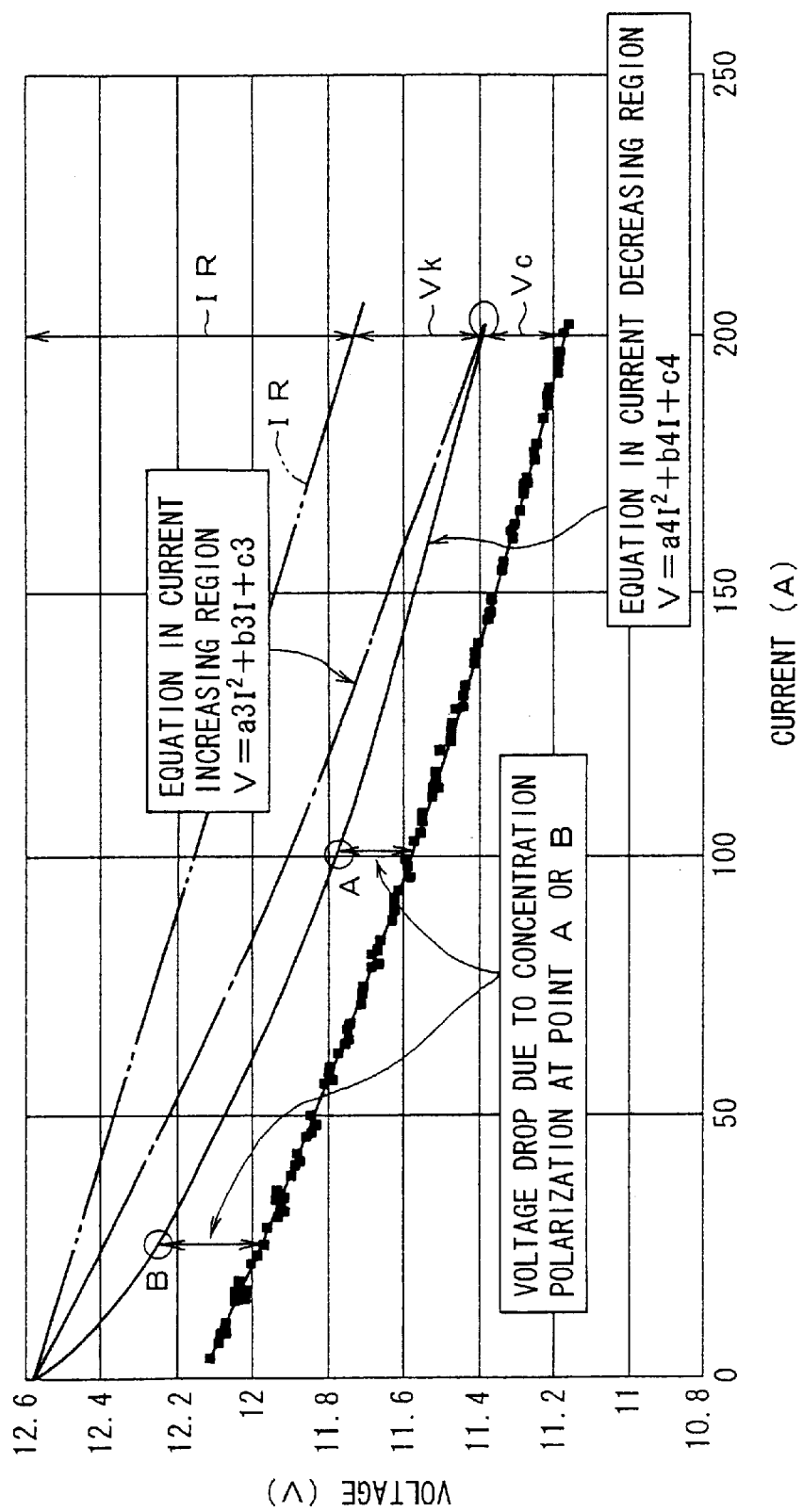
FIG. 6 is a graph particularly showing how to deduct a voltage drop due to a concentration polarization of the battery from the other of the approximate equations within a current decreasing region.

The voltage drops due to the concentration polarization at point A and at point B, which are obtained by the equations (7) and (8), are deducted from equation (2). In use of ordinates at points A, B and the peak, a voltage drop curve due to the base resistance and the activation polarization resistance within the current decreasing region is obtained. The curve is shown hereunder and is illustrated in FIG. 6.

$$V=a4I^2+b4I+c4 \quad (9)$$

The constants a4, b4, and c4 are determined since the equation (9) complies with the ordinates at points A, B and the peak. Note that c4 is equal to c1.

Equation (1) is deducted from equation (9) related to the base resistance and the activation polarization resistance to obtain the following approximate equation which shows a voltage drop due to the concentration polarization within the current decreasing region.

$$Vcg=(a4-a1)I^2+(b4-b1)I \quad (10a)$$

That is, a voltage drop Vcgn due to the concentration polarization at a current In within the current decreasing region is given by:

$$Vcgn=(a4-a1)In^2+(b4-b1)In \quad (10b)$$

Thus, an activation polarization resistance Rcg within the current decreasing region is given by the following equation which shows that Rcg varies with the current.

$$Rcg=(a4-a1)In+(b4-b1) \quad (10c)$$

Accordingly, a voltage drop due to the concentration polarization at any current can be calculated separately from the other voltage drops.

Next, a computing method for obtaining a base resistance of the battery will be discussed. A difference between equation (5) used within the current increasing region and equation (9) used within the current decreasing region is due to an activation polarization of the battery. Therefore, if a deduction of a voltage drop due to the activation polarization is possible, a base resistance would be obtained.

In view of the peak point where a voltage drop included in equation (5) is the same as that of equation (9), a differential R1 of equation (5) and a differential R2 of equation (9) are given by:

$$R1=2 \times a3 \times Ip+b3 \quad (11a)$$

$$R2=2 \times a4 \times Ip+b4 \quad (11b)$$

For example, a discharge current of a battery is simulatively increased from zero to a peak of 200 A during 0.25 seconds and is decreased from the peak to zero during 0.25 seconds. In that case, differentials R1 and R1 at the peak are substantially equal to each other. Therefore, it is practical to obtain a base resistance R by the following equation because R is at least an intermediate value between R1 and R2.

$$R=(R1+R2)/2 \quad (12)$$

In a case of a battery mounted on a vehicle, for example, a DC starter motor has a field coil to which an electrical power is supplied from the battery. At cranking of an engine of the vehicle, a rush current in the field coil increases only during a short time of 3 milliseconds. Thus, a concentration polarization does not occur within the current increasing region. On the contrary, a current decreasing region is 150 milliseconds so that a considerable concentration polarization occurs. However, data obtained in an unstable state of the engine cranking is not used for determining the characteristics between current and voltage of the battery terminals.

Figure 7:
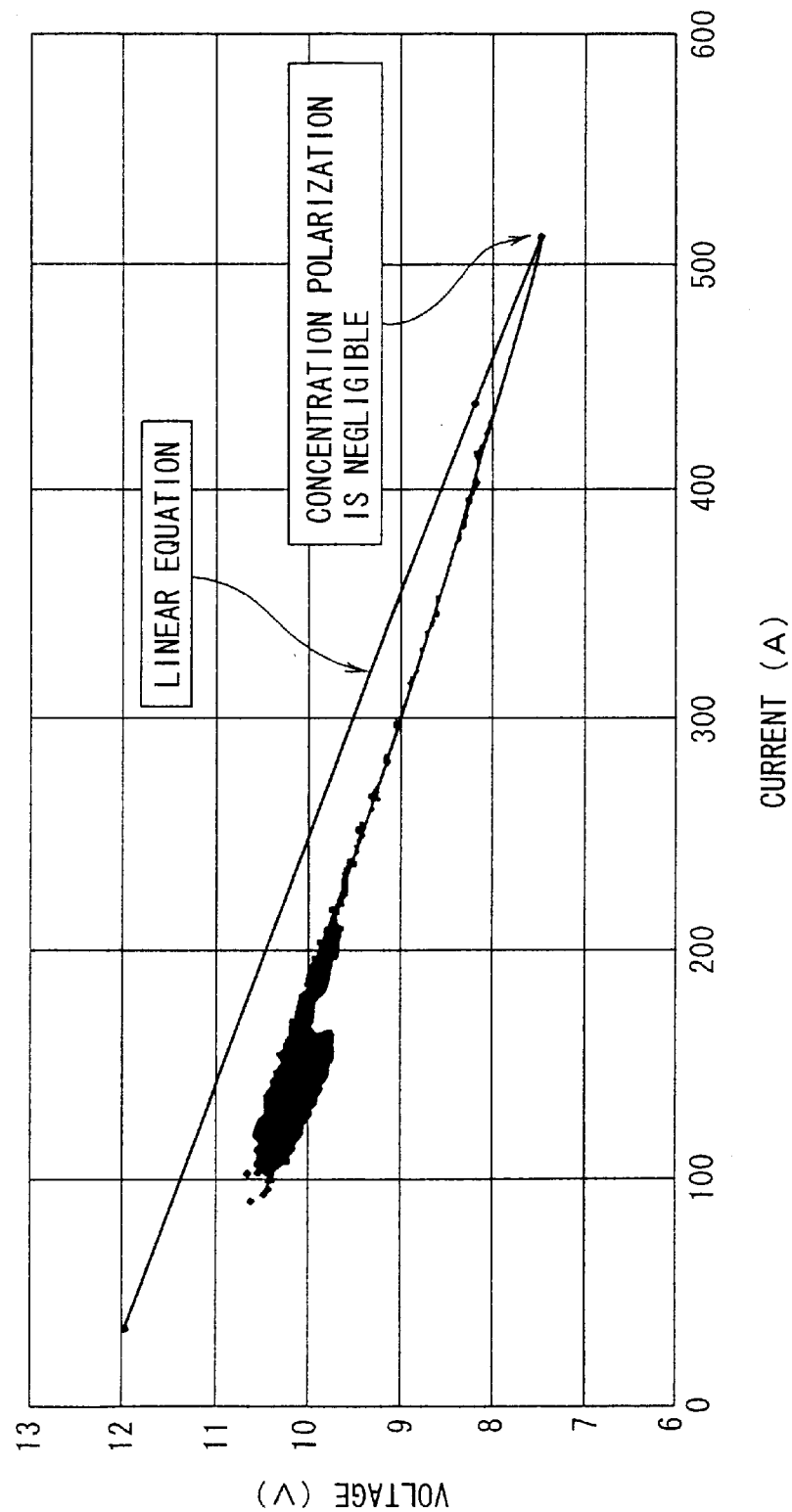
FIG. 7 is a graph showing a relation between a current and a voltage of the battery, the relation being given by an approximate linear equation within a current increasing region.

As illustrated in FIG. 7, the terminal voltage can be given approximately by a line up to a peak in the current increasing region.

In such a case, it is not preferable to obtain R by the equation (12). Because, an amount of the activation polarization is abnormally different between the current increasing region and the current decreasing region.

Therefore, it is preferable that time lengths of the current increasing region and the current decreasing region are used to obtain R at the peak.

That is, R1 is multiplied by a first ratio which is Tz/Ts, while R2 is multiplied by a second ratio which is Tg/Ts to obtain R.

Thus obtained R provides a voltage drop line due to the base resistance as illustrated in FIG. 6, which can provide a voltage drop due to the base resistance at a desired point of the current.

By deducting thus obtained base resistance from equation (5), a voltage drop due to the activation polarization within the current increasing region is given by the following approximate equation.

$$Vkz=a3I^2+(b1-R)I \quad (13a)$$

Therefore, a voltage drop Vkn due to the activation polarization at any current In within the current increasing region is given by:

$$Vkn=a3In^2+(b1-R)In \quad (13b)$$

An activation polarization resistance Rkz within the current increasing region is given by the following equation, and Rkz varies with the current.

$$Rkz=a3In+(b1-R) \quad (13c)$$

By deducting thus obtained base resistance from equation (9), a voltage drop due to the activation polarization within the current decreasing region is given by the following approximate equation.

$$Vkg=a4I^2+(b4-R)I \quad (14a)$$

Therefore, a voltage drop Vgn due to the activation polarization at any current In within the current decreasing region is given by:

$$Vgn=a4In^2+(b4-R)In \quad (14b)$$

An activation polarization resistance Rkg within the current decreasing region is given by the following equation, and Rkg varies with the current.

$$Rkg = a4 In + (b4 - R) \quad (14c)$$

Thus, a voltage drop due to the activation polarization at any current can be calculated separately from the other factors of the battery voltage drop.

In recent vehicles, a three-phase AC motor with no brash is employed. This AC motor requires a comparatively longer time of about 100 milliseconds to reach a peak of a rush current. Thus, a voltage drop curve within the current increasing region is approximately given by a quadratic equation like the foregoing simulative discharging pattern.

Figure 8:
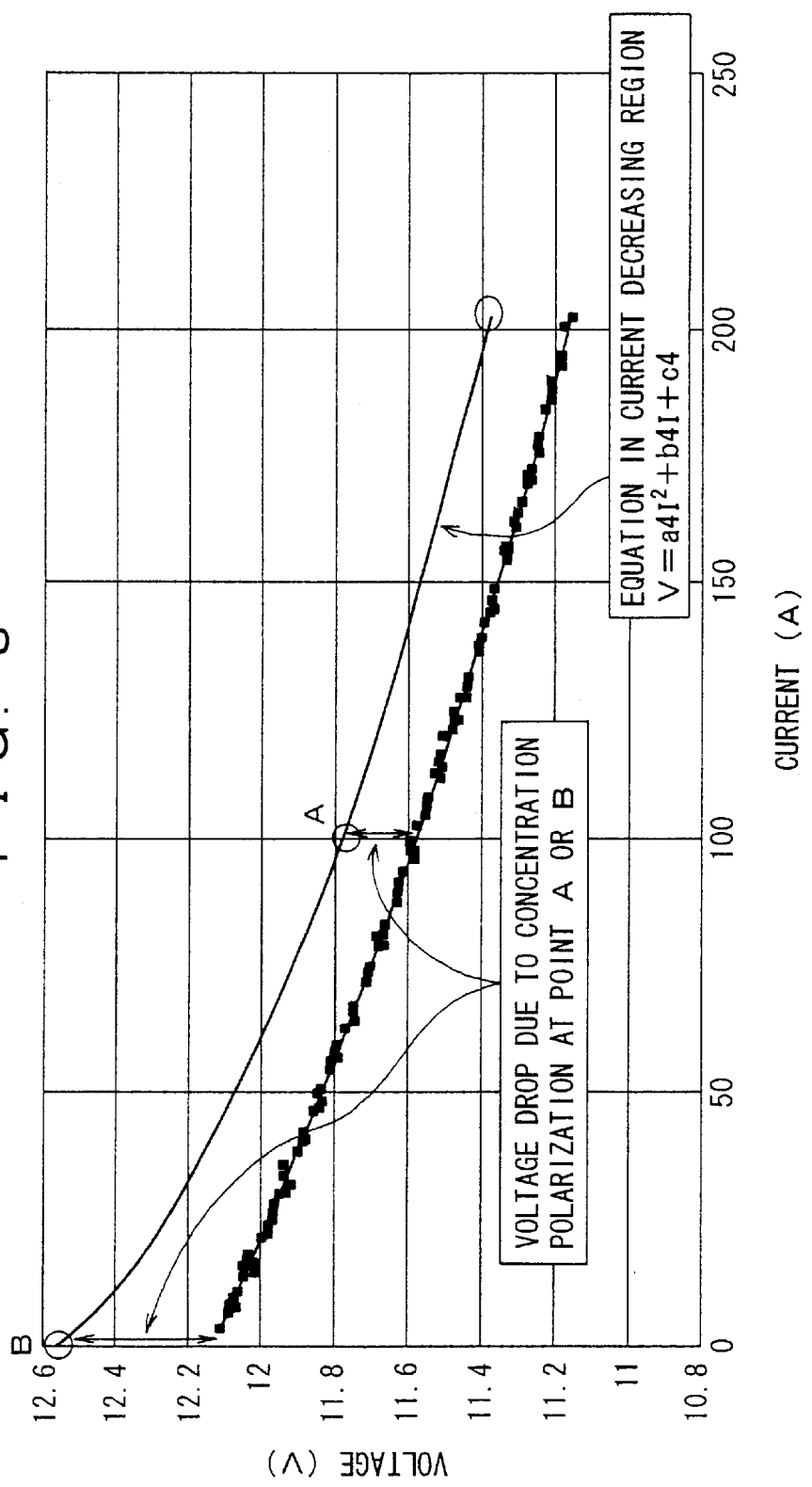
FIG. 8 is a graph particularly showing how to deduct a voltage drop due to a concentration polarization of the battery from one of the approximate equations within a current decreasing region.

To obtain an approximate equation of an activation polarization within the current decreasing region, point B where the current is zero is selected as one of the three coordinates including the peak point as illustrated in FIG. 8. This selection simplifies a process for obtaining the approximate equation.

Figure 9:
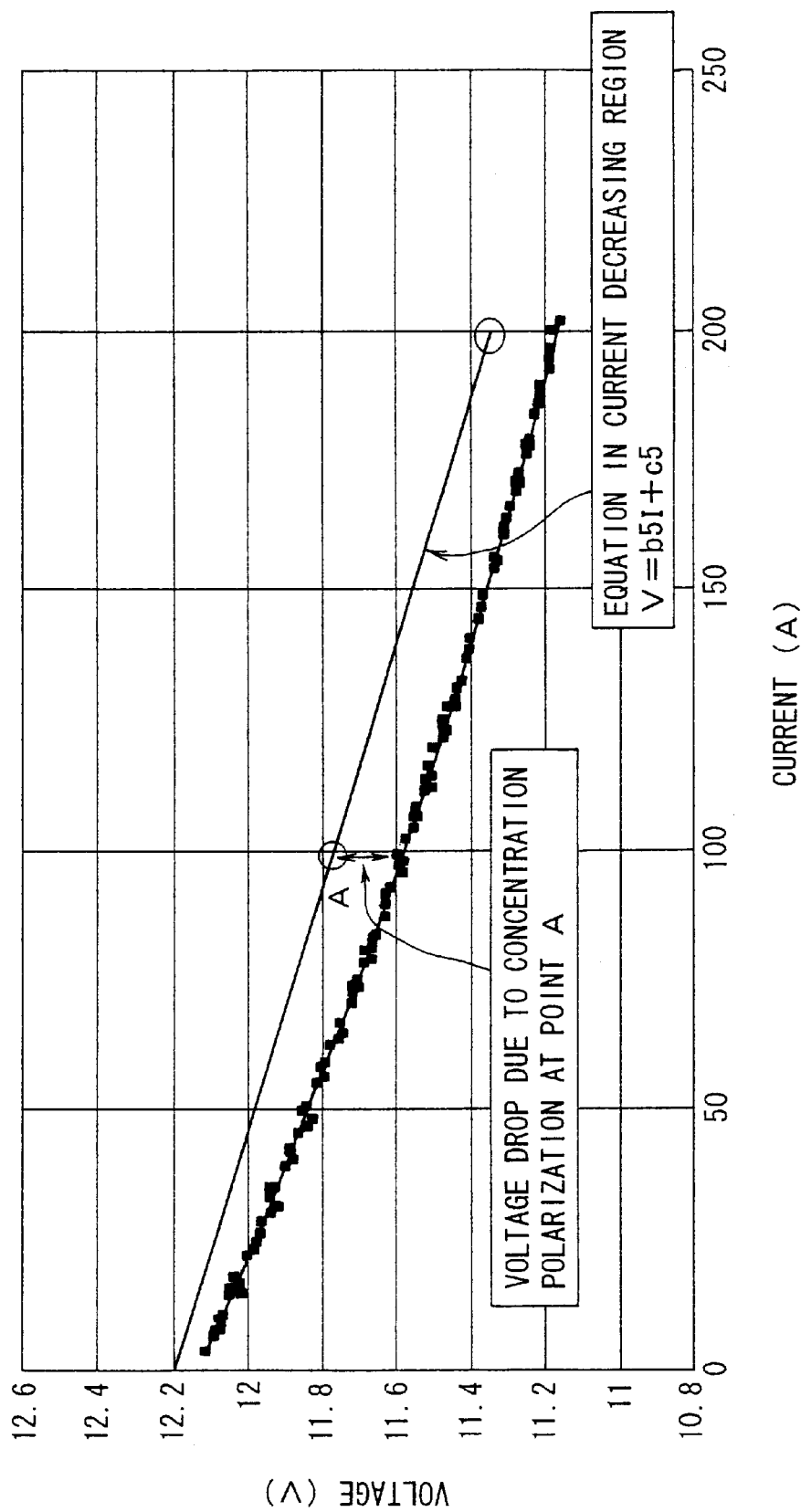
FIG. 9 is another graph particularly showing how to deduct a voltage drop due to a concentration polarization of the battery from one of the approximate equations within a current decreasing region.

Alternatively, to obtain an approximate equation of an activation polarization within the current decreasing region, point A where the current is about a half of the peak current is selected as one of the coordinates including the peak point as illustrated in FIG. 9. In this case, the approximate equation of an activation polarization within the current decreasing region may be obtained by a line connecting point A and the peak point.

In summary of the aforementioned methods, approximate equations of a voltage drop without effects of the concentration polarization is provided in a first step. Next, a voltage drop due to the concentration polarization is obtained by deducting the first step approximate equation from the total original approximate equations derived from the measured data. Next, from differentials of the first approximate equations at the peak point, a base resistance R, which is constant, is obtained. Approximate equations of a voltage drop due to the activation polarization approximate equations are obtained by further deducting RI from the first step approximate equations.

Next, a calculating method of a base resistance of a battery mounted on a vehicle will be discussed in detail. The battery supplies an electrical power to a starter motor through which a rush current flows with an activation polarization of the battery both in a current increasing region and in a current deceasing region of the battery.

After the starting of the battery, a discharge current of the battery increases up to a peak and deceases monotonically toward a constant current. The battery is measured regarding its discharge current and terminal voltage at 100 $\mu$sec intervals of to obtain data thereof.

A latest set of the data of the discharge current and terminal voltage corresponding to a period is stored in a memory such as a RAM. In use of the set of data stored in the memory, two approximate quadratic equations shown by equations (1) and (2) are obtained by a least-squares method, which shows the relation between the discharge current and the terminal voltage. From the two approximate quadratic equations, a voltage drop due to a concentration polarization of the battery is deducted.

At a zero (A) point of the discharge current, a voltage difference between the two approximate equations (1) and (2) is calculated. The voltage difference is provided by a concentration polarization of the battery, because a voltage drop due to a base resistance and an activation polarization does not occur at the zero point of the discharge current. In use of the voltage difference, a voltage drop is obtained at the peak point by equation (1) within the current increasing region.

Next, in use of the voltage drop at the peak point, equation (4) showing a voltage drop due to only the base resistance and the activation polarization is developed. Then, equation (5) for the current increasing region is obtained in use of equations (1) and (4).

Next, from equation (2) for the current decreasing region, an approximate equation without a concentration polarization is obtained. In this process, the peak point and other two points are utilized, and effects of the concentration polarization are deducted. Thereby, a modified quadratic approximate equation (9) is obtained.

Each of thus obtained approximate quadratic equations (5) and (9) is deducted from each of equations (1) and (2) to obtain concentration polarization approximate equations (6a) and (10a). Then, a base resistance R is calculated, and IR is deducted from each of the approximate quadratic equations (13a) and (14a). Thereby, activation polarization approximate equations (13a) and (14a) are obtained.

The base resistance R is calculated by equations (11a) and (11b) with the aforementioned modification related to lengths of the current increasing and decreasing regions.

For example, when the current increasing time is 3 milliseconds and the current decreasing time is 100 milliseconds, a base resistance is given by:

$$R = Rpolk1 \times 3/103 + Rpolk2 \times 100/103$$

where

Rpolk1: a differential at the peak in the current increasing region

Rpolk2: a differential at the peak in the current decreasing region

Figure 1:
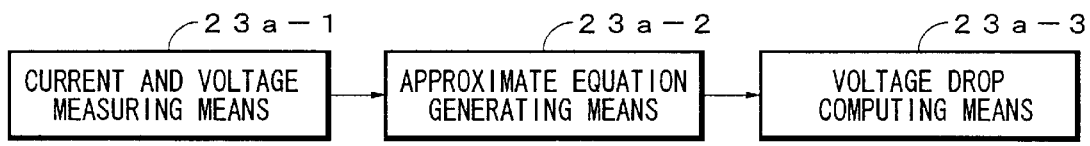
FIG. 1 is a basic block diagram of a unit according to the present invention for computing a voltage drop divided along a plurality of factors for a battery.
Figure 2:
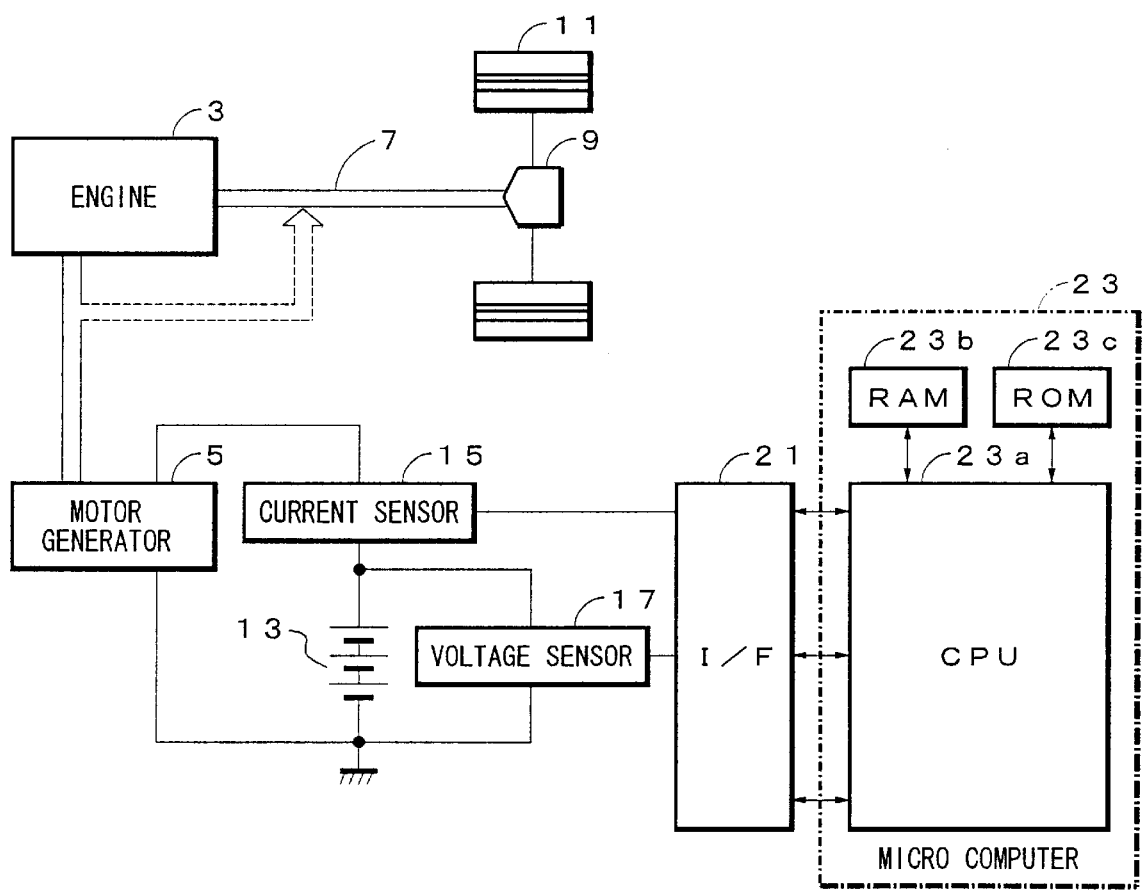
FIG. 2 is an illustration showing a general configuration of the unit, which is partially a block diagram.

Referring to FIG. 2, an embodiment of a unit according to the present invention for computing a voltage drop divided along a plurality of factors for a battery mounted on a motor vehicle will be discussed hereinafter.

FIG. 2 is an illustration showing a general configuration of the unit, which is partially a block diagram. Reference numeral 1 designates the unit which is mounted on a hybrid vehicle having a motor generator 5 in addition to an engine 3.

The hybrid vehicle normally moves by transferring an output of the engine 3 to wheels 11 via a shaft 7 and a differential gear 9. In a high load state of the vehicle, the motor generator 5 is driven to act as a motor by an electrical power supplied from a battery 13. The motor generator 5 assists the output of the engine 3 to drive the wheels 11 via the shaft 7.

In a deceleration or braking state of the hybrid vehicle, the motor generator 5 serves as a generator to change a partial energy of the engine to an electric power for charging the battery 13.

Furthermore, the motor generator 5 functions as a starter motor to forcibly rotate a flywheel of the engine 3 at starting of the engine 3 when a starter switch (not shown) is turned on. At that time, a large rush current flows during a short time through the motor generator 5. After the engine 3 is moved by the motor generator 5, the starter switch is turned off in response to releasing of an ignition key (not shown), and an ignition switch is turned on as well as an accessory switch. In this state, a discharge current from the battery 13 becomes constant.

The unit 1 has a current sensor 15 and a voltage sensor 17. The current sensor is used for sensing a discharge current I supplied from the battery 13 to electrical equipment including the motor generator 5 and a charging current supplied from the motor generator 5 to the battery 13. The voltage sensor 17 has a resistance of about 1 MU for sensing a voltage between a pair of terminals of the battery 13.

Furthermore, the unit 1 includes a micro computer 23 and a non-volatile memory (NVM) 25. The micro computer 23 receives outputs of the current sensor 15 and the voltage sensor 17 via an interface circuit (I/F) 21 after an A/D conversion of the outputs.

The micro computer 23 has CPU 23a, RAM 23b, and ROM 23c. The micro computer 23 is electrically connected to the I/F 21, the starter switch, the ignition switch, the accessory switch, and other switches for electrical equipment (loads).

RAM 23b has a data area for storing various data and a working area for various processes, and CPU 23a stores a control program for executing the processes.

A current and a voltage, which are output from the current sensor 15 or the voltage sensor 17, are sampled at short intervals to be transmitted to CPU 23a of the micro computer 23 via I/F 21. Thus transmitted current and voltage are stored in a data area of RAM 23b to be used in various processes.

The NVM 25 preliminarily stores a data related to a base resistance, an activation polarization resistance, and a concentration polarization resistance corresponding to a predetermined discharge current of the battery 13 which is in a new state with no degradation.

Figure 10:
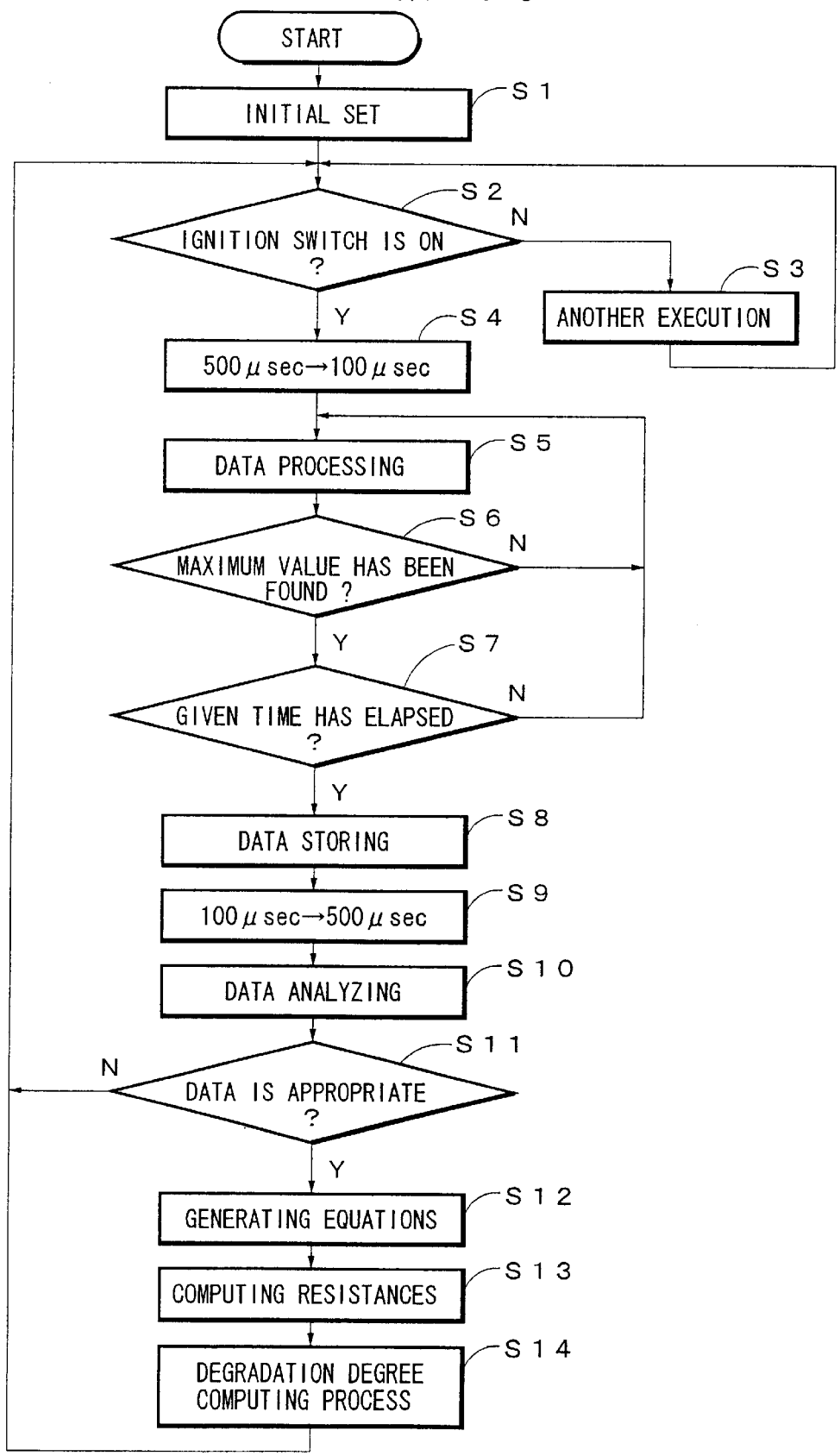
FIG. 10 is a flowchart showing processes executed by a micro computer under control of a program for calculating a degradation degree of the battery.

Next, referring to a flowchart of FIG. 10, processes of CPU 23a along a control program stored in ROM 23c will be discussed hereinafter.

An electrical power supplied from the battery energizes the micro computer 23, so that the program in CPU 23a starts and executes an initial set (step S1).

After the initial set of step S1, CPU 23a determines whether the ignition switch has been turned on (step S2). When the decision is NO, another step is executed (step S3). Step S3 includes a work for obtaining discharge currents and terminal voltages at 500 μsec sampling intervals, and this process is repeated until the decision of step S2 becomes YES. When the ignition switch is turned on, the sampling interval is decreased from 500 μsec to 100 μsec (step S4) so that a rush current sharply varying at the starting of the starter motor can be sensed.

The discharge current I sensed by the sensor 15 and the terminal voltage V sensed by the voltage sensor 15 are processed by an A/D converter to be input into CPU 23a via I/F 21. The input data is stored in a data area of RAM 23b (step S5).

During step S5 for storing the data, each data is compared with a next one in magnitude to find a peak of the rush current (step 6). When a peak is found (YES in step S6), the storing of the data is continued until a predetermined time elapses from the peak. After the predetermined time has elapsed (Yes in step S7), the data across the peak is stored (step S8). After the predetermined time, the sampling interval is brought back to 500 μsec (step S9).

The stored data of the current and voltage is analyzed whether the data is appropriate for obtaining an approximate equation by a least-squares method. That is, the data is analyzed whether the discharge current increases to the peak and decreases to a constant current along a simple pattern (step S10).

When step S11 determines that the analyzed data is appropriate, step S12 sets up quadratic approximate equations (1) and (2) showing relations between the current and the voltage respectively in the current increasing or decreasing region (step S12).

In use of the quadratic approximate equations developed in step S12, step S13 obtains approximate equations of the concentration polarization, a base resistance, and approximate equations of the activation polarization. Then, voltage drops respectively due to the concentration polarization or the activation polarization are calculated at predetermined current points by the obtained approximate equations. Thus obtained voltage drops are stored in a data area of RAM 23b (step 14). After step S14, the execution retunes to step S2.

In the computing unit 1 of the embodiment, step S5 of the flowchart is a process corresponding to the current and voltage measuring means. Step S12 is a process corresponding to the approximate equation generating means, and step S13 is a process corresponding to the resistance computing means.

Next, the computing unit 1 of the embodiment will be discussed in operation thereof.

First, the discharge current and the terminal voltage are measured at regular intervals while a rush current flows, e.g. through a starter from the battery 13.

The rush current increases initially up to a peak and then decreases from the peak to a constant value. RAM 23a stores the data of the discharge current I and the terminal voltage V. The data has been obtained within a predetermined period across the peak. The data is analyzed whether the data is appropriate for obtaining approximate equations by a least-squares method.

The analysis may not be carried out at the same time as the measurement of the discharge current and the terminal voltage of the battery.

In the aforementioned embodiment, a rush current of a starter motor within a period just after the starting of the starter is employed. However, another load with a rush current at its start may be employed as well as the starter motor. In this case, step S4 is executed in response to an operation of a switch of the load in place of the ignition switch. The other processes are substantially the same as those of the flowchart of FIG. 10.

As described above, a present state of a battery is found by separately knowing drops of a terminal voltage since the voltage drops are due to different factors.

It is noted that the present invention can provide a method and a unit for computing a voltage drop of a battery mounted on a motor vehicle to supply an electrical power to loads of the vehicle. The voltage drop is due to a plurality of factors. Each voltage drop due to each factor is separately obtained in use of a correlation between a discharge current and a terminal voltage (I-V) of the battery. The measurement of the discharge current and the terminal voltage can be made while the battery is kept at a usage position.

What is claimed is:

1. A method for computing a voltage drop divided along a plurality of factors for a battery to supply an electrical power to a load, the voltage drop being due to the factors which are separately analyzed in use of a correlation between a discharge current and a terminal voltage of the battery, the method comprising the steps of:

measuring cyclically a discharge current and a voltage between a pair of terminals of the battery while a rush current is flowing in the load electrically connected to the pair of terminals, the rush current simply decreasing from a peak to a constant value after the rush current simply increases up to the peak, obtaining a first approximate equation showing the correlation between the current and the voltage in a region where the discharge current is increasing and a second approximate equation showing a correlation between the current and the voltage is obtained in a region where the discharge current is decreasing, and calculating a voltage from each of the first and second approximate equations at a point where the discharge current is zero so that a difference between the two voltages at the point where the discharge current is zero is obtained, wherein the difference is determined to be a total voltage drop due to a concentration polarization of the battery.

2. A method for computing a voltage drop divided along a plurality of factors for a battery to supply an electrical power to a load, the voltage drop being due to the factors which are separately analyzed in use of a correlation between a discharge current and a terminal voltage of the battery, the method comprising the steps of:

measuring cyclically a discharge current and a voltage between a pair of terminals of the battery while a rush current is flowing in the load electrically connected to the pair of terminals, the rush current simply decreasing from a peak to a constant value after the rush current simply increases up to the peak, obtaining a first approximate equation showing the correlation between the current and the voltage in a region where the discharge current is increasing and a second approximate equation showing a correlation between the current and the voltage is obtained in a region where the discharge current is decreasing, calculating a voltage from each of the first and second approximate equations at a point where the discharge current is zero so that a difference between the two voltages at the point where the discharge current is zero is obtained, wherein the difference is determined to be a total voltage drop due to a concentration polarization of the battery, and calculating a voltage drop due to the concentration polarization from the total voltage drop at any point of the discharge current in use of a relation between the concentration polarization voltage drop and the discharge current with a corresponding discharging time, so that the concentration polarization voltage drop is obtained separately from a voltage drop due to the other factors.

3. A method set forth in claim 2, wherein a voltage drop due to the concentration polarization at any point of the discharge current, is obtained from the total voltage drop due to the concentration polarization in use of a proportional relationship between the concentration polarization voltage drop and a corresponding discharging time elapsed before the point.

4. A method set forth in claim 2, wherein the voltage drop due to the concentration polarization is obtained at the peak of the discharge current.

5. A method for computing a voltage drop divided along a plurality of factors for a battery to supply an electrical power to a load, the voltage drop being due to the factors which are separately analyzed in use of a correlation between a discharge current and a terminal voltage of the battery, the method comprising the steps of:

measuring cyclically a discharge current and a voltage between a pair of terminals of the battery while a rush current is flowing in the load electrically connected to the pair of the terminals, the rush current simply decreasing from a peak to a constant value after the rush current simply increases up to the peak, obtaining a first approximate equation showing the correlation between the current and the voltage in a region where the discharge current is increasing and a second approximate equation showing a correlation between the current and the voltage is obtained in a region where the discharge current is decreasing, calculating a voltage from each of the first and second approximate equations at a point where the discharge current is zero so that a difference between the two voltages at the point where the discharge current is zero is obtained, wherein the difference is determined to be a total voltage drop due to a concentration polarization of the battery, and calculating a voltage drop due to the concentration polarization from the total voltage drop at the peak of the discharge current in use of a proportional relationship between a concentration polarization voltage drop and a corresponding discharging elapsed time, so that the concentration polarization voltage drop is obtained separately from a voltage drop due to the other factors at the peak of the discharge current.

6. A method set forth in claim 5, wherein a voltage drop due to the concentration polarization is obtained at any point of the discharge current within the current increasing region from the concentration polarization voltage drop at the peak in use of a proportional relationship between the concentration polarization voltage drop at the point and a corresponding elapsed time.

7. A method set forth in claim 6, wherein a voltage drop, due to the concentration polarization at any point of the discharge current within the current decreasing region, is obtained from the concentration polarization voltage drop at the peak in use of a proportional relationship between the concentration polarization voltage drop at the point and a corresponding elapsed time at the time.

8. A method set forth in claim 6, wherein voltage drop factors other than the concentration polarization are a base resistance and an activation polarization of the battery.

9. A method set forth in claim 2, wherein a voltage drop due to factors other than the concentration polarization is obtained by deducting a voltage drop due to a concentration polarization of the battery from the first and second approximate equations so that first and second modified approximate equations are developed, and the first and second modified approximate equations are deducted respectively from the first and second approximate equations to provide first and second concentration polarization approximate equations.

10. A method set forth in claim 9, wherein an equation showing a voltage drop due to a base resistance of the battery is deducted respectively from the first and second modified approximate equations to obtain first and second activation polarization approximate equations showing a voltage drop due to an activation polarization of the battery.

11. A method set forth in claim 2, wherein a voltage drop due to the concentration polarization of the battery is deducted from the first and second approximate equations to obtain first and second modified approximate equations, and at the peak of the rush current, a differential of the voltage relative to the current is obtained for each of the first and second modified approximate equations, wherein an intermediate value of thus obtained voltage differentials is determined as a base resistance of the battery.

12. A method set forth in claim 11, wherein the obtained voltage differentials are averaged to obtain the base resistance of the battery.

13. A method set forth in claim 11, wherein the obtained voltage differentials are averaged to determine a base resistance in consideration of time lengths of increasing and decreasing regions of the rush current.

14. A method set forth in claim 11, wherein each of the first and second approximate equations is a quadratic equation.

15. A method set forth in claim 14, wherein constant coefficients of the second approximate equation are determined from three voltage values between zero and the peak of the discharge current including the peak point.

16. A method set forth in claim 15, wherein voltage differentials of the first and second modified approximate equations at the peak point are averaged to obtain the intermediate value.

17. A method set forth in claim 10, wherein an equation showing a voltage drop due to the base resistance of the battery is deducted respectively from the first and second modified approximate equations to obtain first and second activation polarization approximate equations showing a voltage drop due to an activation polarization of the battery.

18. A unit for computing a voltage drop divided along a plurality of factors for a battery to supply an electrical power to a load, the voltage drop being due to the factors which are separately analyzed in use of a correlation between a discharge current and a terminal voltage of the battery, the unit comprising:

a means for measuring cyclically a discharge current and a voltage between a pair of terminals of the battery while a rush current is flowing in the load electrically connected to the pair of terminals, the rush current simply decreasing from a peak to a constant value after the rush current simply increases up to the peak, a means for obtaining a first approximate equation showing the correlation between the current and the voltage in a region where the discharge current is increasing and a second approximate equation showing a correlation between the current and the voltage is obtained in a region where the discharge current is decreasing, a means for calculating a voltage from each of the first and second approximate equations at a point where the discharge current is zero so that a difference between the two voltages at the point where the discharge current is zero is obtained, wherein the difference is determined to be a total voltage drop due to a concentration polarization of the battery, and a means for calculating a voltage drop due to the concentration polarization from the total voltage drop at any point of the discharge current in use of a relation between the concentration polarization voltage drop and the discharge current with a corresponding discharging time, so that the concentration polarization voltage drop is obtained separately from a voltage drop due to the other factors.

19. A unit set forth in claim 18, wherein a voltage drop, due to the concentration polarization at any point of the discharge current, is obtained from the total voltage drop due to the concentration polarization in use of a proportional relationship between the concentration polarization voltage drop and a corresponding discharging time elapsed before the point where the discharge current is obtained.

20. A unit for computing a voltage drop divided along a plurality of factors for a battery to supply an electrical power to a load, the voltage drop being due to the factors which are separately analyzed in use of a correlation between a discharge current and a terminal voltage of the battery, the unit comprising:

a means for measuring cyclically a discharge current and a voltage between a pair of terminals of the battery while a rush current is flowing in the load electrically connected to the pair of the terminals, the rush current simply decreasing from a peak to a constant value after the rush current simply increases up to the peak, a means for obtaining a first approximate equation showing the correlation between the current and the voltage in a region where the discharge current is increasing and a second approximate equation showing a correlation between the current and the voltage is obtained in a region where the discharge current is decreasing, a means for calculating a voltage from each of the first and second approximate equations at a point where the discharge current is zero so that a difference between the two voltages at the point where the discharge current is zero is obtained, wherein the difference is determined to be a total voltage drop due to a concentration polarization of the battery, and a means for calculating a voltage drop due to the concentration polarization from the total voltage drop at the peak of the discharge current in use of a proportional relationship between the concentration polarization voltage drop and a corresponding discharging time, so that the concentration polarization voltage drop is obtained separately from a voltage drop due to the other factors at the peak of the discharge current.

* * * * *